United States Patent
Alford

(10) Patent No.: US 7,411,466 B2
(45) Date of Patent: Aug. 12, 2008

(54) COIL-LESS OVERTONE CRYSTAL OSCILLATOR

(75) Inventor: Ronald C. Alford, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 48 days.

(21) Appl. No.: 11/457,580

(22) Filed: Jul. 14, 2006

(65) Prior Publication Data

US 2008/0024239 A1    Jan. 31, 2008

(51) Int. Cl.
*H03B 5/32* (2006.01)
(52) U.S. Cl. .................. 331/158; 331/135; 331/116 R; 331/116 FE
(58) Field of Classification Search .......... 331/135, 331/158, 116 R, 116 FE
See application file for complete search history.

(56) References Cited

U.S. PATENT DOCUMENTS

| 4,959,624 A | 9/1990 | Higgins, Jr. et al. |
| 5,081,430 A | 1/1992 | Kohsiek |
| 6,556,094 B2 * | 4/2003 | Hasegawa et al. ........... 331/158 |
| 7,002,423 B1 * | 2/2006 | Drakhlis et al. ............. 331/158 |
| 2005/0206463 A1 | 9/2005 | Godambe et al. |

FOREIGN PATENT DOCUMENTS

| WO | 0265631 A1 | 8/2002 |
| WO | 2004054090 A1 | 6/2004 |

* cited by examiner

*Primary Examiner*—Arnold Kinkead
(74) *Attorney, Agent, or Firm*—Gary R Stanford

(57) ABSTRACT

An overtone crystal oscillator including a crystal, multiple amplifiers and an RC network. The crystal has a fundamental resonance frequency and at least one overtone resonance frequency. The amplifiers are coupled in series between terminals of the crystal and the RC network is coupled to the amplifiers. The amplifiers and the RC network are collectively configured to suppress oscillation of the crystal at the fundamental resonance frequency and to enable oscillation at an overtone resonance frequency of the crystal. The amplifiers and the RC network may be configured to cause a phase shift between the fundamental resonance frequency and the overtone resonance frequency. The overtone resonance frequency may be any odd harmonic of the fundamental frequency, such as a third overtone of the crystal. The overtone crystal oscillator may be integrated with CMOS processes and does not require an inductor to suppress the fundamental mode of oscillation.

15 Claims, 3 Drawing Sheets

COIL-LESS OVERTONE CRYSTAL OSCILLATOR

BACKGROUND OF THE INVENTION

1. Field of the Invention

The present invention relates in general to oscillators, and more specifically to an overtone crystal oscillator.

2. Description of the Related Art

A phase-locked loop (PLL) is a basic building block in many electronic circuits, including communication systems and the like, for providing requisite operating frequencies. A timing reference, such as a crystal oscillator, provides a reference frequency $F_{REF}$ which is multiplied by a PLL circuit to achieve a higher output frequency $F_{OUT}$. Crystal oscillators are highly accurate and thus are often used for providing the reference frequency. It is desired to provide a crystal oscillator having its reference frequency ($F_{REF}$) as high as possible. Higher crystal oscillator reference frequencies allow for lower synthesizer close-in phase noise, lower loop divider ratios, and wider PLL bandwidths. The wider PLL bandwidths allow for lower cost and complexity when supporting wider modulation bandwidths in communications systems.

An overtone crystal oscillator is often used to provide the timing reference at a relatively high frequency, such as 100 megahertz (MHz) or more, while avoiding the cost of an expensive inverted-mesa crystal. An overtone crystal oscillator has a fundamental mode of oscillation which is suppressed to ensure oscillation at a higher harmonic frequency, otherwise called the overtone. In many overtone crystal oscillator configurations, an inductor-capacitor (LC) circuit is used to suppress the fundamental frequency of the overtone crystal. The LC circuit uses an inductor (external or internal), which adds extra material and manufacturing cost, printed circuit board (PCB) space or integrated circuit (IC) area, and potentially enables undesired coupling to or from nearby circuitry. The inductor or "coil" is thus an undesired component.

Existing coil-less solutions employ differential bipolar transistor circuit topologies that provide limited sideband noise performance. Complementary metal oxide semiconductor (CMOS) processes provide limited support for bipolar configurations and bipolar configurations are not supported by the more recent generations of fine-line CMOS-only process technologies. It is desired to provide a high frequency, fully integrated overtone crystal oscillator without an inductor. It is further desired to enable the overtone crystal oscillator to be configured such that it can be implemented in a standard CMOS process flow if desired.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
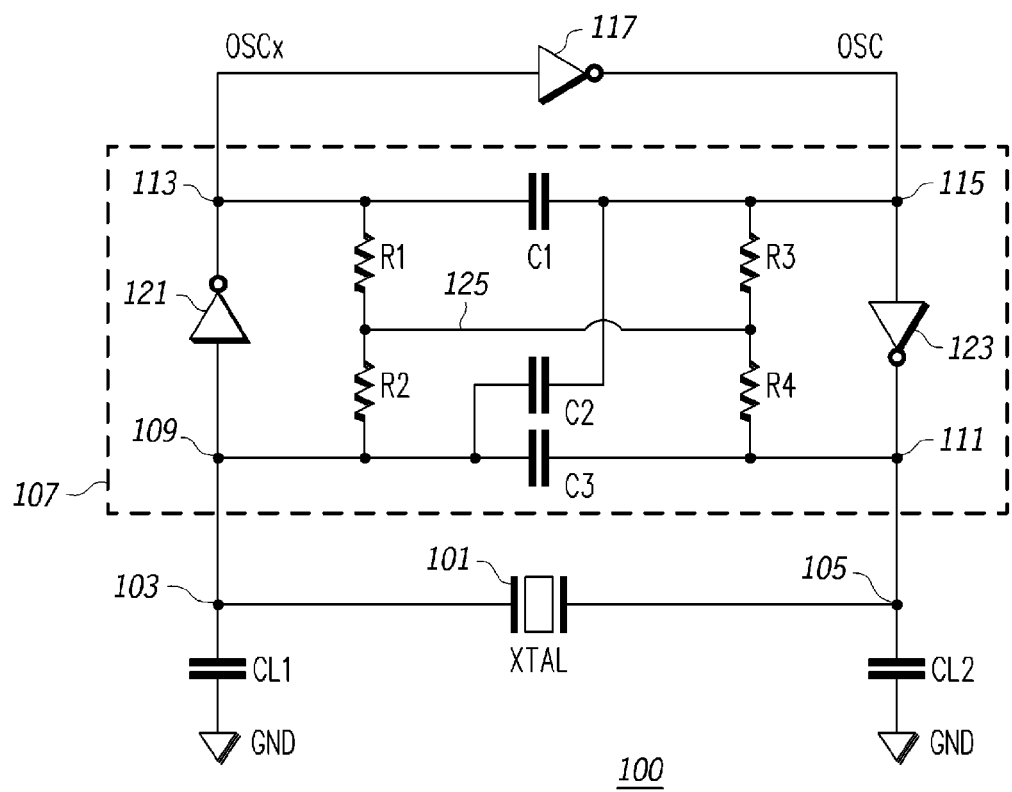
FIG. 1 is a schematic diagram of an overtone crystal oscillator implemented according to an exemplary embodiment of the present invention.

FIG. 1 is a schematic diagram of an overtone crystal oscillator 100 implemented according to an exemplary embodiment of the present invention. The overtone crystal oscillator 100 includes a crystal (XTAL) 101 having two terminals coupled to nodes 103 and 105, respectively. A first load capacitor CL1 is coupled between node 103 and a reference node such as ground (GND) and a second load capacitor CL2 is coupled between node 105 and GND. Nodes 115 and 113 serve as output nodes providing a differential pair of output oscillation signals OSC and OSCx, respectively. Node 103 is coupled to a first input node 109 of a resonant amplifier circuit 107 having a first output node 111 coupled to node 105. The resonant amplifier circuit 107 has another output node 113 coupled to an input of an inverting amplifier 117, which has an output coupled to another input node 115 of the resonant amplifier circuit 107.

The XTAL 101 is manufactured with a fundamental resonant frequency. A conventional crystal oscillator is implemented according to one conventional configuration by removing resonant amplifier 107, shorting together nodes 103 and 113, and shorting together nodes 105 and 115. In this conventional configuration, the load capacitors CL1 and CL2 and the inverting amplifier 117 are configured to enable oscillation at a desired frequency, such as the fundamental resonant frequency of the XTAL 101. In the conventional case, the inverting amplifier 117 is configured to establish a closed-loop voltage gain of at least one (e.g., >0 decibels or dB) and a net closed loop phase shift of zero degrees (0° or a multiple of 360°). The conditions for oscillation are known as the Nyquist criterion as understood by those skilled in the art. If it is desired to have a relatively high resonant frequency, such as on the order of 100 MHz, then the XTAL 101 may be designed with this high resonant frequency. Yet to achieve a high resonant frequency, the XTAL 101 is implemented using a relatively thin and expensive crystal called an inverted-mesa crystal. An inverted-mesa crystal is prohibitively expensive and not suitable for many cost sensitive applications, including, for example, high volume mobile electronic communications.

It is known to replace the XTAL 101 with an overtone crystal having a fundamental resonant frequency that is significantly less than the target high frequency of interest. The XTAL 101 may also be configured to oscillate at odd harmonic frequencies or overtones, such as the third overtone (3OT). For example, to achieve a 100 MHz overtone oscillator, the XTAL 101 has a fundamental resonant frequency of approximately 33 MHz. The inverting amplifier 117, in this case, is not designed to encourage oscillation at the fundamental frequency but instead to encourage oscillation at the selected overtone frequency. The fundamental resonant frequency, however, is further suppressed with additional circuitry to ensure oscillation at the target overtone. In one conventional configuration, a resonant inductor-capacitor (LC) circuit (not shown) is employed (e.g., passive LC circuit coupled between node 105 and GND) to suppress oscillation at the fundamental frequency of the overtone crystal. The LC circuit, however, uses an external or internal inductor, which adds extra material and manufacturing cost, printed circuit board (PCB) space or IC area, and potentially enables undesired coupling to or from nearby circuitry of the electronic device. It is desired to provide a coil-less solution to avoid undesirable results or characteristics.

The resonant amplifier circuit 107 is configured to suppress oscillation at the fundamental frequency of the XTAL 101 and to ensure oscillation at a selected overtone frequency, such as the third overtone. The resonant amplifier circuit 107 includes an inverting amplifier 121 having its input coupled to the node 109 (for coupling to node 103) and its output coupled to node 113. The resonant amplifier circuit 107 includes another inverting amplifier 123 having its input coupled to the node 115 and its output coupled to node 111 (for coupling to node 105). A resistor-capacitor (RC) network is coupled to the inverting amplifier 121 and 123. In particular, a first pair of resistors R1 and R2 are coupled in series between nodes 109 and 113 and a second pair of resistors R3 and R4 are coupled in series between nodes 111 and 115. The intermediate nodes of the pairs of resistors R1, R2 and R3, R4 are coupled together at a node 125. A first capacitor C1 is coupled between the output of the inverting amplifier 121 and the input of the inverting amplifier 123. A second capacitor C2 is coupled between the inputs of the inverting amplifiers 121 and 123. And a third capacitor C3 is coupled between the output of the inverting amplifier 123 and the input of the inverting amplifier 121.

As described further below, the inverting amplifiers 121, 117 and 123 along with the RC network (including the load capacitors CL1 and CL2) collectively form a closed-loop phase shift versus frequency characteristic that suppresses the fundamental frequency of the overtone XTAL 101 while ensuring oscillation at a selected overtone frequency. One benefit of the overtone crystal oscillator 100 is that an inductor is not necessary to suppress the fundamental frequency. Another benefit is that each component (other than the XTAL 101) may be implemented in a standard CMOS process. One conventional configuration employs bipolar devices that are not suitable for modern CMOS-only processes. The overtone crystal oscillator 100, however, may be integrated onto a CMOS chip, where the XTAL 101 is also either integrated onto the chip or provided as an external component.

Figure 2:
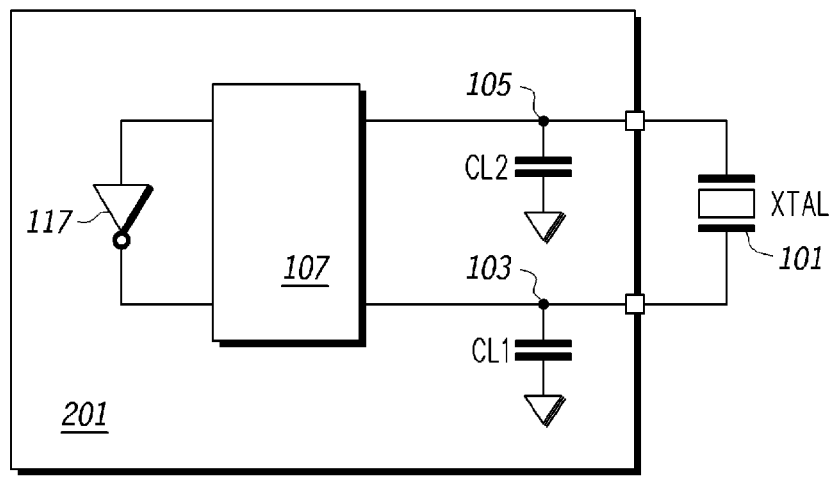
FIG. 2 is a simplified block diagram illustrating an exemplary integrated configuration of the overtone crystal oscillator of FIG. 1.

FIG. 2 is a simplified block diagram illustrating an exemplary integrated configuration. The XTAL 101 is coupled between a pair of pins of an integrated circuit (IC) 201. The load capacitors CL1 and CL2, the resonant amplifier circuit 107 and the inverting amplifier 117 are integrated onto the IC 201. As shown, the load capacitors CL1 and CL2 are internally coupled to the nodes 103 and 105, respectively, which are further coupled to the resonant amplifier circuit 107 and to the IC pins for coupling to the XTAL 101. The inverting amplifier 117 is internally coupled to the resonant amplifier circuit 107. In an alternative configuration, the load capacitors CL1 and CL2 are not integrated onto the IC 201 but are externally provided and coupled. The IC 201 may be a CMOS chip such as manufactured using CMOS processes.

Figure 3:
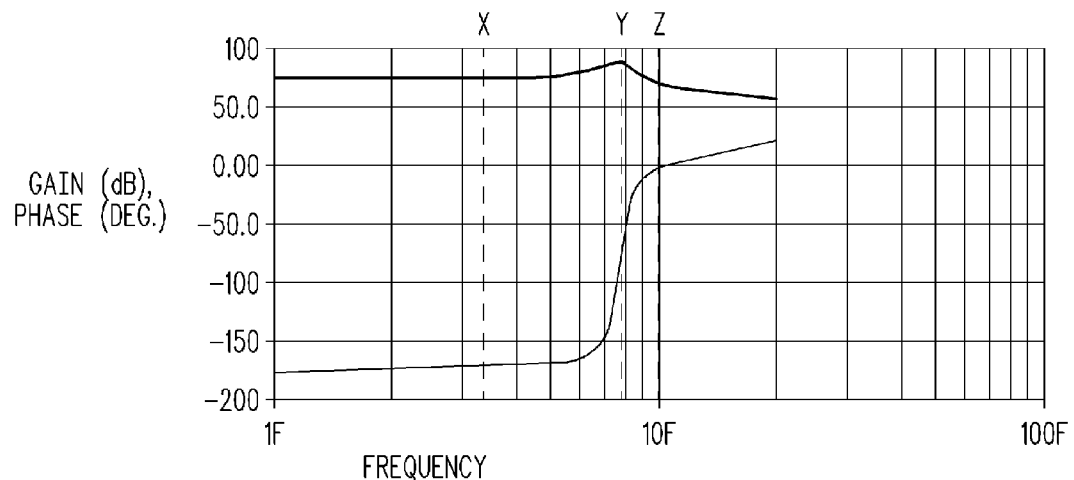
FIG. 3 is a graphic diagram plotting the open-loop gain and phase characteristics of the resonant amplifier circuit of FIG. 1 versus frequency.

FIG. 3 is a graphic diagram plotting the open-loop gain (dB) and phase (degrees) characteristics of the resonant amplifier circuit 107 versus frequency scaled as a frequency multiple F. In this case frequency is plotted on a logarithmic scale from 1F to 100F. The frequency multiple F may be any suitable multiple, such as 1 MHz, 10 MHz, 100, MHz, etc. In the illustrated configuration, the fundamental frequency of the XTAL 101 is a frequency of X (at about 3.3 F) having a third overtone frequency of Z (at about 10 F), such that Z is approximately three times that of X. The resonant amplifier circuit 107 is configured to have a resonance frequency of Y which is greater than the fundamental frequency of X while less than the third overtone of Z (e.g., Z>Y>X). As shown, the resonant amplifier circuit 107 exhibits a gain peaking (or overshoot) and a substantial phase shift at the frequency Y. As a non-limiting example for F=10 MHz, X is approximately 33 MHz and Z is approximately 100 MHz. For measuring the response of the open loop configuration of the resonant amplifier circuit 107, an input signal is applied across or between nodes 109 and 115 and the output is measured across or between nodes 111 and 113. In the illustrated configuration, the resistances of the resistors R1, R2, R3 and R4 are approximately equal (e.g., R1≈R2≈R3≈R4≈R) (in which the approximation symbol "≈" means "approximately equal to"), the capacitors CL1, CL2, C1 and C3 are approximately equal to each other (e.g., CL1≈CL2≈C1≈C3≈C), and the capacitor C2≈0.5 C. At the fundamental frequency of X MHz, the resonant amplifier circuit 107 exhibits a relatively large phase shift (e.g., roughly −150 degrees), which inhibits oscillation of the closed-loop configuration at the fundamental frequency. At the target overtone output frequency of Z, however, the phase of the resonant amplifier circuit 107 is approximately zero degrees (or a multiple of 360 degrees) while its gain is such that it enables a closed-loop gain of greater than one to enable oscillation at Z.

Figure 4:
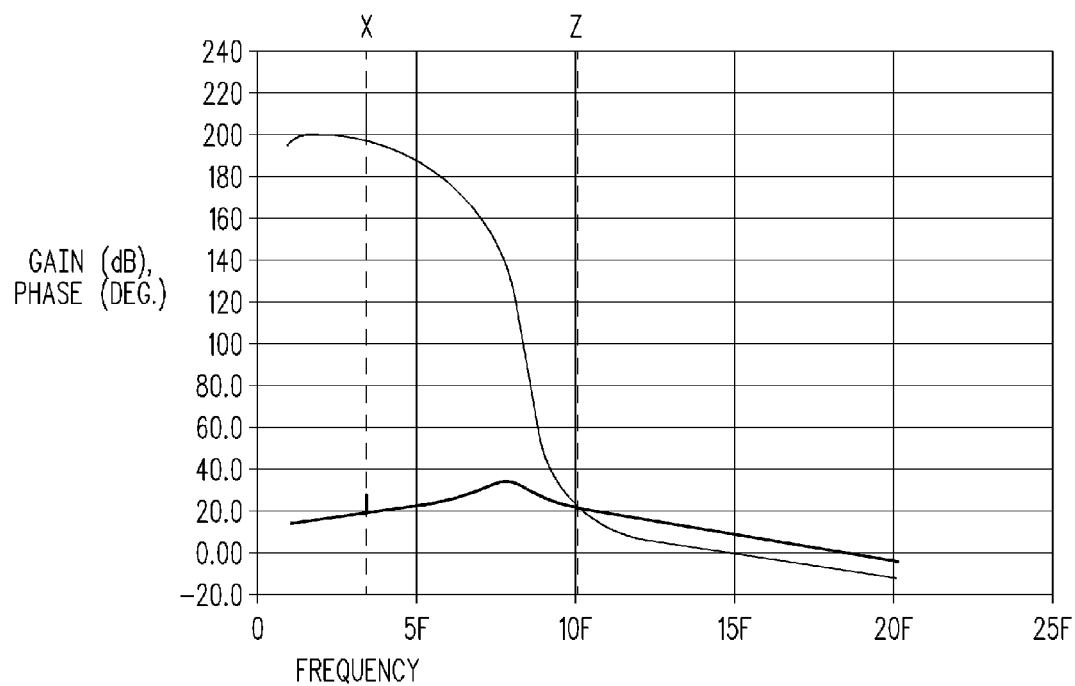
FIG. 4 is a graphic diagram plotting the closed-loop gain and phase characteristics of the overtone crystal oscillator of FIG. 1 versus frequency.
Figure 5:
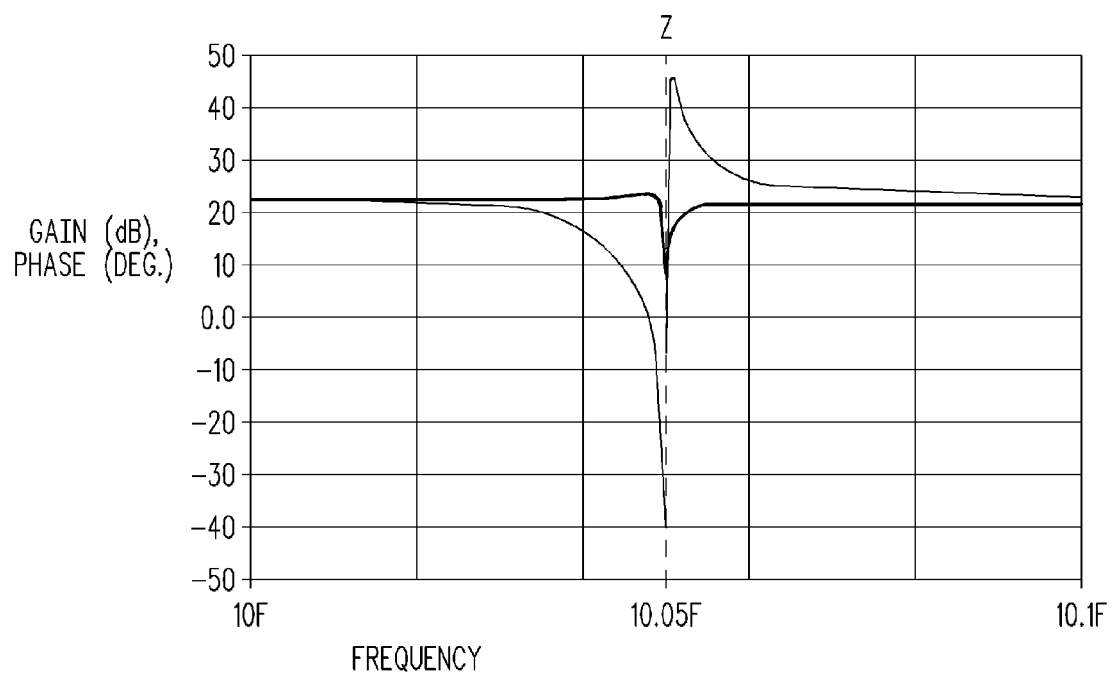
FIG. 5 is a graphic diagram plotting the closed-loop gain and phase characteristics of the overtone crystal oscillator of FIG. 1 versus frequency, which is similar to FIG. 4 yet zoomed in on the oscillation frequency.

FIG. 4 is a graphic diagram plotting the closed-loop gain (dB) and phase (degrees) characteristics of the overtone crystal oscillator 100 versus frequency scaled as a frequency multiple F. FIG. 5 is a graphic diagram plotting the closed-loop gain and phase characteristics of the overtone crystal oscillator 100 versus frequency again scaled as a frequency multiple F and zoomed in on the oscillation frequency Z. The plot of FIG. 4 appears to show the phase at about 20 degrees at the desired frequency of oscillation at Z. As shown in FIG. 5, however, the closed-loop gain of the overtone crystal oscillator 100 remains greater than zero dB while its phase crosses through zero degrees at the target overtone frequency of Z, which occurs at a frequency of approximately 10.05 F. In particular, the phase quickly drops to well below zero and then quickly increases to well above zero while the frequency is increased from just below Z to just above Z as a result of the crystal's overtone resonance at the target frequency of oscillation of Z. While the gain drops over 10 dB during this transition, it remains above zero. In this manner, the overtone crystal oscillator 100 is configured to oscillate at the frequency of Z as desired. Although the closed-loop gain of the overtone crystal oscillator 100 is greater than zero dB at the fundamental frequency of X as shown in FIG. 4, its phase remains greater than 180 degrees. In this manner, the overtone crystal oscillator 100 does not meet the phase portion of the Nyquist criterion at the frequency X and thus is unable to oscillate at the fundamental frequency of the XTAL 101.

In a very specific configuration for a target output frequency of approximately 100 MHz, Z≈100 MHz, Y≈33 MHz, X≈80 MHz, C≈2.88 picofarads (pF) and R is about 600Ω (or within the range of 400 to 800Ω). The gain and operating characteristics of the inverting amplifiers 121, 117 and 123 are adjusted to achieve oscillation at approximately 100 MHz. It is appreciated, however, that the operating characteristics of the inverting amplifiers 121, 117 and 123, and the value of R and C are adjusted accordingly for the particular overtone frequency of interest for the selected XTAL 101. For example, the component values are adjusted to achieve the desired overtone frequency oscillation for a different XTAL having a different fundamental frequency. Furthermore, it is possible to achieve oscillation at higher odd harmonic frequencies, such as the fifth overtone, the seventh overtone, etc., when the fundamental frequency and the intermediate overtones are suppressed.

An overtone crystal oscillator according to an embodiment of the present invention includes a crystal, multiple amplifiers and an RC network. The crystal has a fundamental resonance frequency and at least one overtone resonance frequency. The amplifiers are coupled in series between terminals of the crystal and the RC network is coupled to the amplifiers. The amplifiers and the RC network are collectively configured to suppress oscillation of the crystal at the fundamental resonance frequency and to enable oscillation at an overtone resonance frequency of the crystal.

The amplifiers and the RC network may be configured to cause a phase shift between the fundamental resonance frequency and the overtone resonance frequency. The overtone resonance frequency may be any odd harmonic of the fundamental frequency, such as a third overtone of the crystal. In a more specific embodiment, the third overtone is selected and is approximately 100 megahertz. The amplifiers and the RC network are suitable for implementation using CMOS processes so that the entire overtone crystal oscillator may thus be integrated onto a CMOS integrated circuit.

In a more specific configuration, the amplifiers include a first inverting amplifier having an input coupled to a first terminal of the crystal, a second inverting amplifier having an input coupled to the output of the first inverting amplifier and an output, and a third inverting amplifier having an input coupled to the output of the second inverting amplifier and an output coupled to the other terminal of the crystal. The RC network may include a first capacitor coupled between the output of the first inverting amplifier and the input of the third inverting amplifier, a second capacitor coupled between the input of the third inverting amplifier and the input of the first inverting amplifier, a third capacitor coupled between the output of the third inverting amplifier and the input of the first inverting amplifier, a first pair of resistors coupled in series between the input and the output of the first inverting amplifier and forming a first intermediate node, and a second pair of resistors coupled in series between the input and the output of the third inverting amplifier and forming a second intermediate node which is coupled to the first intermediate node. Furthermore, the RC network may include a pair of load capacitors coupled on either end of the crystal.

A resonant amplifier circuit for coupling in the feedback path of a crystal oscillator according to an embodiment of the present invention includes first and second inverting amplifiers and an RC circuit. The crystal oscillator has a crystal with first and second terminals coupled to load capacitance and an inverting amplifier circuit. The first inverting amplifier has an input for coupling to the first terminal of the crystal and an output for coupling to an input of the inverting amplifier circuit. The second inverting amplifier has an input for coupling to an output of the inverting amplifier circuit and an output for coupling to the second terminal of the crystal. The RC circuit is coupled to the first and second inverting amplifiers. The first and second inverting amplifiers and the RC circuit are collectively configured to suppress oscillation of the crystal oscillator at a fundamental resonance frequency and to enable oscillation at an overtone resonance frequency of the crystal oscillator.

The inverting amplifiers and the RC network may be configured to collectively have an open-loop resonance between the fundamental resonance frequency and the overtone resonance frequency of the crystal. The inverting amplifiers and the RC network may also collectively exhibit a gain peaking (or overshoot) and a phase shift between the fundamental resonance frequency and the overtone resonance frequency. The inverting amplifiers and the RC network are integrated onto a CMOS integrated circuit. The RC network may include a first capacitor coupled between the output of the first inverting amplifier and the input of the second inverting amplifier, a second capacitor coupled between the input of the second inverting amplifier and the input of the first inverting amplifier, a third capacitor coupled between the output of the first inverting amplifier and the input of the first inverting amplifier, a first pair of resistors coupled in series between the input and the output of the first inverting amplifier and forming a first intermediate node, and a second pair of resistors coupled in series between the input and the output of the second inverting amplifier and forming a second intermediate node which is coupled to the first intermediate node.

An integrated circuit for enabling oscillation of an externally coupled overtone crystal according to an embodiment of the present invention includes first and second pins, multiple amplifiers coupled in series between the first and second pins, and an RC network. The amplifiers and the RC network are collectively configured to suppress oscillation of the crystal at a fundamental resonance frequency of the crystal while enabling oscillation of at least one overtone resonance frequency of the crystal.

The amplifiers and the RC network may be integrated onto a CMOS integrated circuit. The amplifiers may include a first inverting amplifier having an input coupled to the first pin and an output, a second inverting amplifier having an input coupled to the output of the first inverting amplifier and having an output, and a third inverting amplifier having an input coupled to the output of the second inverting amplifier and having an output coupled to the second pin.

The RC network may include a first capacitor coupled between the output of the first inverting amplifier and the input of the third inverting amplifier, a second capacitor coupled between the input of the third inverting amplifier and the input of the first inverting amplifier, a third capacitor coupled between the output of the third inverting amplifier and the input of the first inverting amplifier, a first pair of resistors coupled in series between the input and the output of the first inverting amplifier and forming a first intermediate node, and a second pair of resistors coupled in series between the input and the output of the third inverting amplifier and forming a second intermediate node which is coupled to the first intermediate node. The RC network may further include a pair of load capacitors, each coupled between a corresponding one of the first and second pins and ground. The first, second and third inverting amplifiers and the RC network may be configured to suppress oscillation of the crystal at the fundamental resonance frequency and to enable oscillation at a selected overtone resonance frequency.

Although the present invention has been described in considerable detail with reference to certain preferred versions thereof, other versions and variations are possible and contemplated. For example, each of the inverting amplifiers 121, 117 and 123 may be implemented by multiple amplifiers including non-inverting amplifiers and the like. Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. An overtone crystal oscillator, comprising:
a crystal having first and second terminals and having a fundamental resonance frequency and at least one overtone resonance frequency;
a plurality of amplifiers coupled in series between said first and second terminals, comprising:
a first inverting amplifier having an input coupled to said first terminal of said crystal and having an output;
a second inverting amplifier having an input coupled to said output of said first inverting amplifier and having an output; and
a third inverting amplifier having an input coupled to said output of said second inverting amplifier and having an output coupled to said second terminal of said crystal; and
a resistor-capacitor (RC) network coupled to said plurality of amplifiers, comprising:
a first capacitor coupled between said output of said first inverting amplifier and said input of said third inverting amplifier;
a second capacitor coupled between said input of said third inverting amplifier and said input of said first inverting amplifier;
a third capacitor coupled between said output of said third inverting amplifier and said input of said first inverting amplifier;
a first pair of resistors coupled in series between said input and said output of said first inverting amplifier and forming a first intermediate node; and
a second pair of resistors coupled in series between said input and said output of said third inverting amplifier and forming a second intermediate node which is coupled to said first intermediate node;
wherein said plurality of amplifiers and said RC network are collectively configured to suppress oscillation of said crystal at said fundamental resonance frequency and to enable oscillation at said at least one overtone resonance frequency of said crystal.

2. The overtone crystal oscillator of claim 1, wherein said plurality of amplifiers and said RC network are configured to cause a phase shift between said fundamental resonance frequency and said at least one overtone resonance frequency.

3. The overtone crystal oscillator of claim 1, wherein said at least one overtone resonance frequency comprises a third overtone of said crystal.

4. The overtone crystal oscillator of claim 3, wherein said third overtone is approximately 100 megahertz.

5. The overtone crystal oscillator of claim 1, wherein said plurality of amplifiers and said RC network are integrated onto a CMOS integrated circuit.

6. The overtone crystal oscillator of claim 1, wherein said RC network further comprises a pair of load capacitors, each coupled between a corresponding one of said first and second terminals of said crystal and ground.

7. The overtone crystal oscillator of claim 6, wherein said first, second and third inverting amplifiers and said RC network are integrated onto a CMOS integrated circuit.

8. A resonant amplifier circuit for coupling in the feedback path of a crystal oscillator, the crystal oscillator having a crystal with first and second terminals coupled to load capacitance and an inverting amplifier circuit, said resonant amplifier comprising:
a first inverting amplifier having an input for coupling to the first terminal of the crystal and an output for coupling to an input of the inverting amplifier circuit;
a second inverting amplifier having an input for coupling to an output of the inverting amplifier circuit and an output for coupling to the second terminal of the crystal; and
a resistor-capacitor (RC) circuit coupled to said first and second inverting amplifiers, comprising:
a first capacitor coupled between said output of said first inverting amplifier and said input of said second inverting amplifier;
a second capacitor coupled between said input of said second inverting amplifier and said input of said first inverting amplifier;
a third capacitor coupled between said output of said first inverting amplifier and said input of said first inverting amplifier;
a first pair of resistors coupled in series between said input and said output of said first inverting amplifier and forming a first intermediate node; and
a second pair of resistors coupled in series between said input and said output of said second inverting amplifier and forming a second intermediate node which is coupled to said first intermediate node;
wherein said first and second inverting amplifiers and said RC circuit are collectively configured to suppress oscillation of the crystal oscillator at a fundamental resonance frequency and to enable oscillation at an overtone resonance frequency of the crystal oscillator.

9. The resonant amplifier circuit of claim 8, wherein said first and second inverting amplifiers and said RC network collectively have an open-loop resonance between said fundamental resonance frequency and said overtone resonance frequency.

10. The resonant amplifier circuit of claim 8, wherein said first and second inverting amplifiers and said RC network collectively exhibit a gain peaking overshoot and a phase shift between said fundamental resonance frequency and said overtone resonance frequency.

11. The resonant amplifier circuit of claim 8, wherein said first and second inverting amplifiers and said RC network are integrated onto a CMOS integrated circuit.

12. An integrated circuit for enabling oscillation of an externally coupled overtone crystal, the overtone crystal oscillator having a fundamental resonance frequency and at least one overtone resonance frequency, said integrated circuit comprising:
first and second pins for coupling to the crystal;
a plurality of amplifiers coupled in series between said first and second pins, comprising:
a first inverting amplifier having an input coupled to said first pin and having an output;
a second inverting amplifier having an input coupled to said output of said first inverting amplifier and having an output; and
a third inverting amplifier having an input coupled to said output of said second inverting amplifier and having an output coupled to said second pin; and
a resistor-capacitor (RC) network coupled to said plurality of amplifiers, comprising:
a first capacitor coupled between said output of said first inverting amplifier and said input of said third inverting amplifier;
a second capacitor coupled between said input of said third inverting amplifier and said input of said first inverting amplifier;

third capacitor coupled between said output of said third inverting amplifier and said input of said first inverting amplifier;
a first pair of resistors coupled in series between said input and said output of said first inverting amplifier and forming a first intermediate node; and
a second pair of resistors coupled in series between said input and said output of said third inverting amplifier and forming a second intermediate node which is coupled to said first intermediate node;

wherein said plurality of amplifiers and said RC network are collectively configured to suppress oscillation of the crystal at said fundamental resonance frequency and to enable oscillation at said at least one overtone resonance frequency of the crystal.

13. The IC of claim 12, wherein said plurality of amplifiers and said RC network are integrated onto a CMOS integrated circuit.

14. The IC of claim 13, wherein said RC network further comprises a pair of load capacitors, each coupled between a corresponding one of said first and second pins and ground.

15. The overtone crystal oscillator of claim 13, wherein said first, second and third inverting amplifiers and said RC network are configured to suppress oscillation of the crystal at the fundamental resonance frequency and to enable oscillation at a selected overtone resonance frequency.

* * * * *